(12) United States Patent
Tsuk et al.

(10) Patent No.: US 8,504,345 B1
(45) Date of Patent: Aug. 6, 2013

(54) STATE-SPACE MODEL-BASED SIMULATORS AND METHODS

(75) Inventors: Michael J. Tsuk, Arlington, MA (US); Jacob K. White, Belmont, MA (US)

(73) Assignee: SAS IP, Inc., Cheyenne, WY (US)

( * ) Notice: Subject to any disclaimer, the term of this patent is extended or adjusted under 35 U.S.C. 154(b) by 844 days.

(21) Appl. No.: 12/577,844

(22) Filed: Oct. 13, 2009

(51) Int. Cl.
 *G06F 17/50* (2006.01)
 *G06F 7/60* (2006.01)
 *G06F 17/10* (2006.01)
 *G06G 7/62* (2006.01)

(52) U.S. Cl.
 USPC .................................. 703/14; 703/2; 703/13

(58) Field of Classification Search
 USPC ................................................ 703/2, 13, 14
 See application file for complete search history.

(56) References Cited

U.S. PATENT DOCUMENTS

| | | | |
|---|---|---|---|
| 5,553,097 A | 9/1996 | Dagher | |
| 6,349,272 B1 * | 2/2002 | Phillips | 703/2 |
| 6,675,137 B1 * | 1/2004 | Toprac et al. | 703/2 |
| 8,245,165 B1 * | 8/2012 | Tiwary et al. | 716/108 |
| 2011/0010410 A1 | 1/2011 | DeLaquil et al. | |
| 2011/0218789 A1 | 9/2011 | Van Beurden | |

OTHER PUBLICATIONS

Astolfi, A new look at model reduction by moment matching for linear systems, Decision and Control, 2007 46th IEEE Conference, pp. 4361-4366, Dec. 12-14, 2007.*

A.C. Antoulas, A new result on passivity preserving model reduction, Systems & amp; Control Letters, vol. 54, Issue 4, Apr. 2005, pp. 361-374.*

Mayo, A. J., and A. C. Antoulas. "A framework for the solution of the generalized realization problem." Linear algebra and its applications 425.2 (2007): 634-662.*

Bracken et al. S-Domain Methods for Simultaneous Time and Frequency Characterization Electromagnetic Devices, IEEE Transactions on Microwave Theory and Techniques, 46(9):1277-1290 (1998).

Chen, et al, Per-Unit-Length RLGC Extraction Using a Lumped Pori De-Embedding Method for Application on Periodically Loaded Transmission Lines, 2006 Electronic Components and Technology Conference, pp. 1770-1775.

Degerstrom et al, Accurate Resistance, Inductance, Capacitance, and Conductance (RLGC) From Uniform Transmission Line Measurements, Proceedings of the 18th Topical Meeting on Electrical Performance of Electronic Packaging, Oct. 2006, pp. 77-80.

Eisenstadt et al. S-Parameter-Based IC Interconnect Transmission Line Characterization, IEEE Transactions on Components, Hybrids, and Manufacturing Technology, 15(4): 483-490 (Aug. 1992).

Fitzpatrick, On the Scalar Rational Interpolation Problems, Math. Control Signals Systems, 9:352-369 (1996).

Gruodis, et al, Coupled Lossy Transmission Line Characterization and Simulation, IBM J. Res. Develop., 25(1): 25-41 (Jan. 1981).

(Continued)

*Primary Examiner* — Mary C Jacob
*Assistant Examiner* — Aniss Chad
(74) *Attorney, Agent, or Firm* — Goodwin Procter LLP; Steven A. Moore (57) ABSTRACT

A simulator includes an analysis module for extracting a state-space model of response of a physical system to an input from a frequency-domain representation thereof, using a SVD, and singular vectors thereof, of a Loewner matrix derived from the frequency-domain representation, and a simulator module for simulating the response of the physical system in the time domain based on the extracted state-space model.

22 Claims, 5 Drawing Sheets

OTHER PUBLICATIONS

Han et al, Frequency-Dependent RLGB Extraction for a Pair of Coupled Transmission Lines Using Measured Four-Port S-Parameters, 63rd ARTFG Conference Digest, Jun. 2004, pp. 211-219.

Hill et al, Crosstalk Between Microstrip Transmission Lines, IEEE Transactions on Electromagnetic Compatibility, 36(4):314-321 (Nov. 1994).

Hiptmair, Symmetric Coupling for Eddy Current Problems, SIAM J, Numer. Anal. 40(1):41-64 (2002).

Karam, Computation of the One-Dimensional Unwrapped Phase, Massachusetts Institute of Technology Thesis, Jan. 2006, 101 pages.

Kim et al, Implementation of Broadband Transmission Line Models with Accurate Low Frequency response for High-Speed System Simulations, DesignCon 2006, 25 pages.

Kiziloglu et al, Experimental Analysis of Transmission Line Parameters in High-Speed GsAs Digital Circuit Interconnects, IEEE Transactions on Microwave Theory and Techniques, 39(*):1361-1367 (Aug. 1991).

Knockaert et al, Recovering Lossy Multiconductor Transmission Line Parameters From Impedance or Scattering Representations, Proceedings of the 10th Topical Meeting on Electrical Performance of Electronic Packaging, Cambridge, MA, Oct. 2001, pp. 35-38.

Knockaert et al, Recovering Lossy Multiconductor Transmission Line Parameters From Ipedance or Scattering Representations, IEEE Transactions on Advanced Packaging, 25(2):200-205 (May 2002).

Lalgudi et al, Accurate Transient Simulation of Interconnects Characterization by Band-LImited Data With Propagation Delay Enforcement in a Modified Nodal Analysis Framework, IEEE Transactions on Electromagnetic Compatibility, 50(3):715-729 (Aug. 2008).

Lee et al, A Non-Overlapping Domain Decomposition Method with Non-Matching Grids for Modeling Large Finite Antenna Arrays, J. Comput. Phys., 203:1-21 (Feb. 2005).

Leung et al, Characterization and Attenuation Mechanism of CMOS-Compatible Micromachined Edge-Suspended Coplanar Waveguides on Low-Resistivity Silicon Substrate. IEEE Transactions on Advanced Packaging. 29(3):498-503 (Aug. 2006).

Narita et al, An Accurate Experimental Method for Characterizing Transmission Lines Embedded in Multilayer Printed Circuit Boards, IEEE Transactions on Advanced Packaging, 29(1):114-121 (Feb. 2006).

Oh et al, Improved Method for Characterizing Transmission Lines Using Frequency-Domain Measurements, Proceedings of the 13th Topical Meeting on Electrical Performance of Electronic Packaging. pp. 127-130 (Jul. 2004).

Sampath, On Addressing the Practical Issues in the Extraction of RLGC Parameters for Lossy Multiconductor Transmission Lines Using S-Parameter Models, Proceedings of the 18th Topical Meeting of the Electrical Performance of Electronic Packaging, pp. 259-262 (Oct. 2008).

Antoulast, A.C., "On the Scalar Rational Interpolation Problem" *IMA Jrl. of Mathematical Control and Information*, 3 (1986) pp. 61-88.

Benner et al., "Partial Realization of Descriptor Systems" *Systems and Control Letters*, col. 55, Issue 11 (Nov. 2006) pp. 929-938. (Jun. 13, 2006 preprint).

Blackburn, "Fast Rational Interpolation, Reed-Solomon Decoding, and the Linear Complexity Profiles of Sequences", *IEEE Transactions on Information Theory*, vol. 43, No. 2 (Mar. 1997).

Cai et al., "Displacement Structure of Weighted Pseudoinverses" *Applied Mathematics and Computation*, vol. 153, Issue 2 (Jun. 4, 2004) pp. 317-335.

Gallivan et al., "Model Reduction of MIMO Systems Via Tangential Interpolation" *SIAM J. Matris Anal. Appl.*, vol. 26, No. 2, pp. 328-349.

Gallivan et al., "Model reduction via tangental interpolation" in MTNS2002 (15th Symp. on the Mathematical Theory of Networks and Systems) (2002) 6 pages.

Gallivan et al., "Model Reduction via Trancation: An Interpolation Point of View" *Linear Algebra and its Applications*, 375 (2003) pp. 115-134.

Lefteriu et al., "Modeling Multi-Port Systems from Frequency Response Data via Tangential Interpolation" *IEEE*, (2009).

Li et al., "Model Order Reduction of Linear Networks with Massive Ports via Frequency-Dependent Port Packing" 2006 43rd ACM/IEEE Design Automation Conference, (2006) pp. 267-272.

Schrama, "Approximate Identification and Control Design with Application to a Mechanical System," Delft University of Technology, Thesis (1992).

Vandendorpe, "Model Reduction of Linear Systems, and Interpolation Point of View," Univ. Catholique de Louvain, Center for Systems Engineering and Applied Mechanics (Dec. 1, 2004).

Woracek, "Multiple Point Interpolation in Nevanlinna Classes" *Integral Equations and Operator Theory*, vol. 28, No. 1 (Mar. 1997).

Al-Nashi, Phase unwrapping of digital signals, 1989, IEEE Transactions on Acoustics, Speech, and Signal Processing, 37(11):1693-1702.

Karam et al., Computation of the One-Dimensional Unwrapped Phase, 2007, Proceedings of the 2007 15th International Conferenction Digital Signal Processing, pp. 304-307.

Tribolet, J., A new phase unwrapping algorithm, 1977, IEEE Transactions on Acoustics, Speech, and Signal Processing, ASSP-25(2):170-177.

Tripathi et al., A SPICE model for multiple coupled microstrips and other transmission lines, 1985, IEEE Transactions on Microwave Theory and Techniques, MTT-33(12):1513-1518.

Hebermehl et al, Improved numerical methods for the simulation of microwave circuits, 1997, Weierstrass Institute for Applied Analysis and Stochastics, pp. 1-14.

Peng et al, Non-conformal domain decomposition method with second-order transmission conditions for timeharmonic electromagnetics, Journal of Computational Physics 229, Apr. 10, 2010, pp. 5615-5629.

Zhao et al, A Domain Decomposition Method With Nonconformal Meshes for Finite Periodic and Semi-Periodic Structures IEEE Transactions on Antennas and Propagation, vol. 55, No. 9, Sep. 2007.

Wolfe et al, A Parallel Finite-Element Tearing and Interconnecting Algorithm for Solution of the Vector Wave Equation with PML Absorbing Medium IEEE Transaction on Antennas and Propagation, vol. 48, No. 2, Feb. 2000.

Gutknecht, Block Krylov Space Methods for Linear Systems with Multiple Right-hand sides: An Introduction, pp. 1-22, 2006.

Badics et al, A Newton-Raphson Algorithm With Adaptive Accuracy Control Based on a Block-Preconditioned Conjugate Gradient Technique, pp. 1662-1655, 2005.

* cited by examiner

STATE-SPACE MODEL-BASED SIMULATORS AND METHODS

TECHNICAL FIELD

In various embodiments, the present invention relates to simulation systems utilizing state-space models, in particular state-space models extracted from singular value decompositions of Loewner matrices.

BACKGROUND

Measurement and simulation strategies for characterizing the response of a given system to an input, e.g., the electrical behavior of interconnect and packaging structures for electronic circuits, often utilize a frequency-domain approach. Physically, such an approach is equivalent to applying sinusoidal excitations to the terminals, or ports, of a structure and then measuring the response at the same and/or other ports. The relation between excitations and responses, and how those relations vary with sinusoidal frequency, are used to calculate scattering parameters. For a structure with p ports, measured at K frequencies (where K is typically hundreds or thousands), the scattering-(or S-) parameter data is a set of K matrices, where each matrix is a set of p×p complex numbers. The entry in the $i^{th}$ row and $j^{th}$ column of the matrix associated with a particular frequency f indicates how a sinusoidal excitation with frequency f applied to port j will affect the response at port i.

Circuit simulators, which are typically used to compute the time evolution of voltages and currents in complicated circuits, often require accurate representations of the electrical behavior of interconnect and packaging used to couple circuit blocks. For this reason, almost all commercial circuit simulators have some method for converting models of packaging and interconnect represented using frequency-domain S-parameter data into models that are suitable for time-domain simulation. A wide variety of methods are in common use, with convolution-based approaches being the most established.

The more modern and now preferred strategy for using S-parameter data in time-domain circuit simulation is to construct a p-input, p-output system of linear differential equations whose response to sinusoid excitations closely matches the responses represented by the corresponding S-parameter data. Such a system of differential equations, usually referred to as a state-space model, is easily included in time-domain circuit simulation.

The typical form for an $n^{th}$-order state-space model is $$E\dot{x}(t)=Ax(t)+Bu(t) \qquad (1)$$

$$y(t)=Cx(t)+Du(t) \qquad (2)$$

where x(t) is an n-length vector and represents the model's state, u(t) is a p-length vector representing the input to the model, y(t) is a p-length vector representing the output of the model, and A, E, B, C, and D are n×n, n×n, n×p, p×n, and p×p real matrices, respectively. A is the "state transition" matrix that specifies the dynamics of the modeled system. One challenge in extracting a state-space model from S-parameter data is determining the order of the model, n, as well as the entries of the matrices A, E, B, C, and D, such that the frequency response (i.e., the response to sinusoids of different frequencies) of the state-space model matches the S-parameter data.

The response of a linear state-space model to a sinusoidal input is a sinusoid of the same frequency, so the frequency response of a state-space system is easily determined analytically. The variable s is commonly used to represent a generalized frequency of excitation, leading to the identity $$\frac{d}{dt} \to s.$$

This identity is then used to determine the frequency response of a state-space model, as in $$H(s)=C(sE-A)^{-1}B+D. \qquad (3)$$

where H(s) is a p×p matrix of complex values that depend on s. For an accurate state-space model, when s is equal to the purely imaginary value s=j2πf (where j=$\sqrt{-1}$), H(s) should match the given S-parameter data at frequency f.

Almost all of the state-of-the-art algorithms for extracting state-space models from S-parameter data are based on a general multi-step fitting-based strategy:

1) The order of the model, n, is selected via iterative rational fitting.

2) The state-space system poles or resonant modes (equivalently, the matrices A and E) are determined by a frequency-response matching procedure. The fitting procedure is most commonly applied to each of p single-input p-output "columns" of relations, and the resulting sets of poles are combined.

3) The unstable poles are removed, as such poles correspond to models whose behavior will grow unrealistically towards infinity.

4) With A and E now fixed, the B, C, and D matrices are selected so as to match the S-parameter data as closely as possible.

5) If desired, the values of B, C, and D are perturbed so as to ensure the state-space model is passive (does not generate energy). For systems having no source of external power, e.g., packaging and interconnect schemes, violating passivity generates conspicuous errors.

While generally useful, these iterative approaches to rational fitting are fundamentally uncontrollable, and therefore not robust. There is no mathematical proof that iterative rational fitting converges, and there are many examples where such methods generate unstable state-space models.

There are many alternatives for each step of the above five-step procedure. However, existing methods for extracting a state-space model based on projection or matching approaches are unable to determine the state-space model directly from S-parameter data. Existing projection strategies inherently sample only a fraction of the data, leading to models with unreliable accuracy, and existing matching approaches can be numerically unstable. In addition, both projection and matching methods typically generate unstable models, particularly when the S-parameter data is based on actual measurement data.

SUMMARY

In various embodiments, the foregoing limitations of existing state-space model-based simulations are herein addressed through the use of the singular-value decomposition (SVD) of Loewner matrices constructed from S-parameter data. The singular values of the Loewner matrix are used to determine the order of the state-space model, and the singular vectors of the Loewner matrix are used to directly determine the state-space model. The approach described herein is faster and more efficient than the prior-art techniques described above. Whereas a properly scaled Loewner matrix may be used to quickly determine the lowest-order model needed for a fit of a given accuracy, the five-step fitting procedure described above must "hunt" for that order iteratively.

In specific embodiments, the SVD of the Loewner matrix is used to extract models for each of $p^2$ single input-output relations, or for each of p single-input p-output "columns" of relations, and then the poles from each model are combined. Such an approach replaces the first two steps of the above-described five-step fitting-based procedure. Extraction using Loewner matrices enables the generation of state-space models for systems with large numbers of ports without discarding data; thus, embodiments of the techniques described herein are superior to the commonly used iterative rational fitting methods for generating the poles of the system in the first step of the procedure described above. The approach herein described is more robust than prior-art methods; as a non-iterative technique, the problem of ensuring convergence does not occur. Moreover, embodiments of the present invention can be implemented in a computationally efficient manner, as it is unnecessary to search for the correct order of state-space model that generates a sufficiently accurate fit. Further, embodiments of the invention efficiently utilize the SVD of only a single Loewner matrix, thus reducing computation time.

Embodiments of the invention also utilize the SVD of Loewner matrices to generate system poles rather than an entire state-space description, enabling the initial removal of unstable poles. Further, various embodiments incorporate frequency scaling, thus enabling the modeling and simulation based on non-uniformly-spaced frequency data.

In an aspect, embodiments of the invention feature a simulator including an analysis module and a simulator module. The analysis module is for extracting a state-space model of response of a physical system to an input from a frequency-domain representation thereof, using a SVD, and singular vectors thereof, of a Loewner matrix derived from the frequency-domain representation. The simulator module is for simulating the response of the physical system in the time domain based on the extracted state-space model.

Embodiments of the invention may include one or more of the following. The simulator may include an input module for receiving input signals for at least a portion of the modeled physical system. The modeled physical system may include or consist essentially of an electronic circuit. The input signals may be in the form of digital values representative of signal levels at terminals of the electronic circuit. The simulator module may produce simulated output values from the modeled electronic circuit based on the input signals. The simulator may include an output module for supplying the simulated output values to at least one of a display, a device, or another simulator module. The Loewner matrix may be scaled, e.g., frequency-scaled.

In another aspect, embodiments of the invention feature a method of simulation. Operation of a physical system is represented in the frequency domain, and a state-space model of the response of the physical system to an input is extracted from the frequency-domain representation using a SVD, and singular vectors thereof, of a Loewner matrix derived from the frequency-domain representation. The response of the physical system is simulated based on the state-space model.

Embodiments of the invention may include one or more of the following. The state-space model may be a time-domain model. The frequency-domain representation may include or consist essentially of a set of scattering parameters. Extracting the state-space model may include or consist essentially of using the SVD to generate system poles of the state-space model. The SVD may be used to extract models for a plurality of single input-output relations of the scattering parameters. The SVD may be used to extract models for each of p single-input p-output columns of relations among the scattering parameters.

The Loewner matrix may be scaled, e.g., frequency-scaled. The SVD may indicate an optimal order of the state-space model. The physical system may include or consist essentially of an electronic circuit. The method may include receiving, from a user, input signals for at least a portion of the electronic circuit. The input signals may be in the form of digital values representative of signal levels at terminals of the electronic circuit. The simulating step may produce simulated output values from the modeled electronic circuit. The method may include using the output values to drive a device and/or a second simulation.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Simulation System

Figure 1:
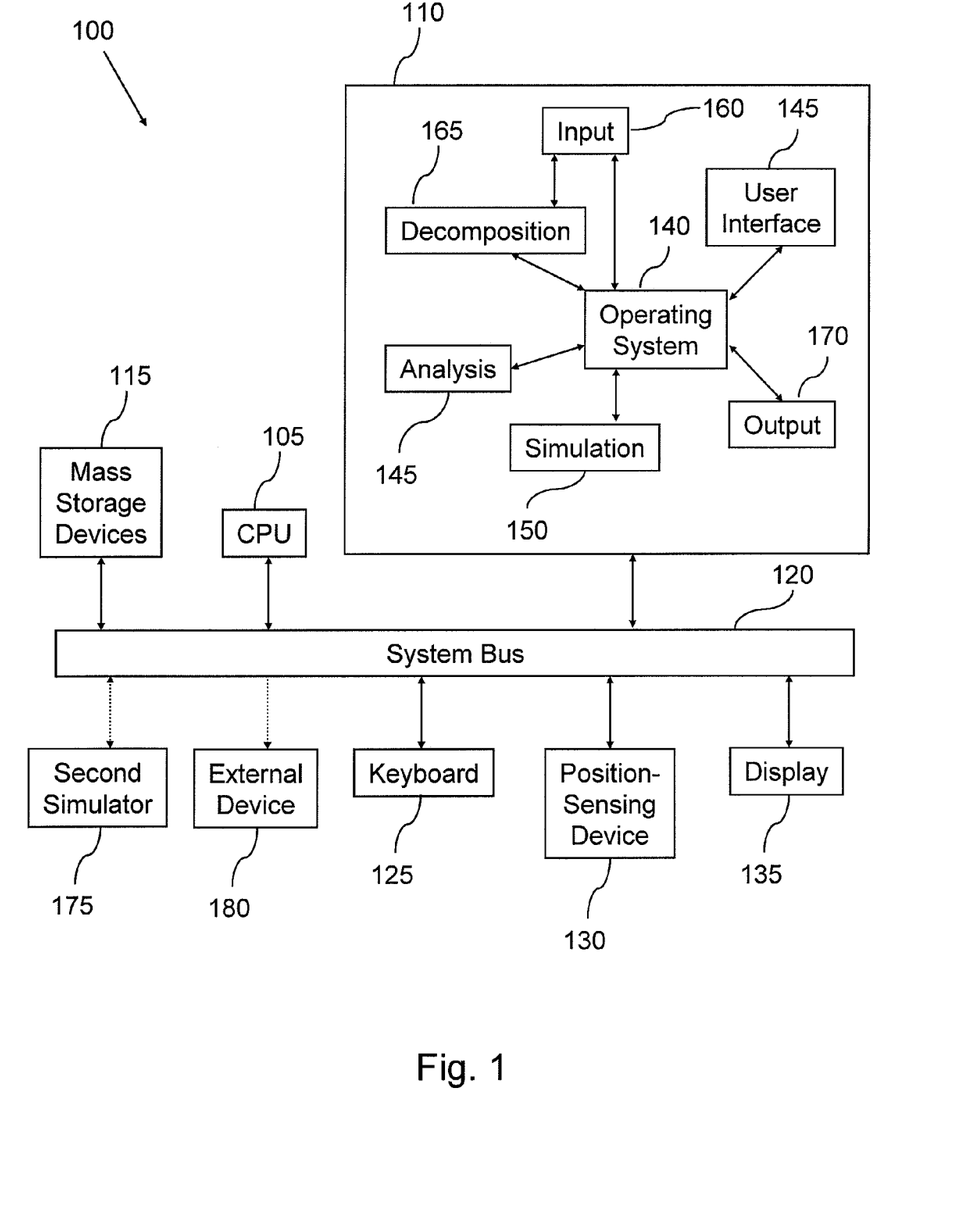
FIG. 1 is a schematic block diagram of an exemplary simulator in accordance with various embodiments of the invention.

Referring to FIG. 1, in various embodiments of the invention, a simulator 100 includes a central-processing unit (CPU) 105, a main memory 110, and one or more mass storage devices 115 all connected to a system bus 120, over which all of the components of the system communicate. CPU 105 directs the operation of simulator 100, and each mass storage device 115 stores, e.g., input data and/or output data for retrieval and/or further processing. A user may interact with simulator 100 using a keyboard 125 and/or a position-sensing device (e.g., a mouse or trackball) 130. The output of either device may be used to designate information or select particular areas of a display 135 to direct functions to be performed by simulator 100.

The main memory 110 contains a group of modules that control the operation of CPU 105 and its interaction with other hardware components. An operating system 140 directs the execution of low-level, basic system functions such as memory allocation, file management, and operation of mass storage devices 115. At a higher level, an analysis module 145 and a simulation module 150 direct execution of the primary functions performed by embodiments of the invention, as discussed below, and a user interface module 155 enables straightforward interaction with simulator 100 over display 135.

An input module 160 accepts input data corresponding to a system or network to be simulated from, e.g., a mass storage device 115, keyboard 125, and/or position-sensing device 130, or in some implementations, from an external signal source. The input data may include or consist essentially of digitized information corresponding to the system to be simulated, e.g., an electrical circuit (and/or the interconnect network and/or packaging thereof) or any of a variety of other physical (e.g., mechanical) systems (such as the turbulent flow of a fluid through a pipe when the input and output flows are not turbulent). As used herein, the term "physical system" refers to physical structures, objects, or substances that exhibit time-evolving behavior. For example, the input data may be digital values representing signal levels at terminals of an electronic circuit. Generally, the input data will be a representation of the system in the frequency domain. A decomposition module 165 converts such input data into a set of S-parameters for further processing (as described below) using techniques well-established in the art (see, for example, B. Young, *Digital Signal Integrity: Modeling and Simulation with Interconnects and Packages*, Prentice Hall (2000).). Alternatively, input module 160 may directly accept as input data the set of S-parameters, obviating the need for processing by decomposition module 165.

An output module 170 directs output data from analysis module 145 and/or simulation module 150 to, e.g., a mass storage device 115 for storage, display 135 for presentation, a second simulator 175 for further analysis and/or simulation, and/or an external device 180 to operate as an input thereto (e.g., as a control signal to an electronic device).

Although the modules in main memory 110 have been described separately, this is for clarity of presentation only. As long as simulator 100 performs all necessary functions, it is immaterial how they are distributed therewithin and the programming or hardware architecture thereof. Furthermore, the above-described implementation is exemplary only. Other hardware approaches are possible, e.g., the various modules of embodiments of the invention may be implemented on a general-purpose computer programmed with appropriate software instructions implementing the functions described below, or as hardware circuits (e.g., as an application-specific integrated circuit, or ASIC), or as mixed hardware-software combinations.

Simulation Method

Figure 2:
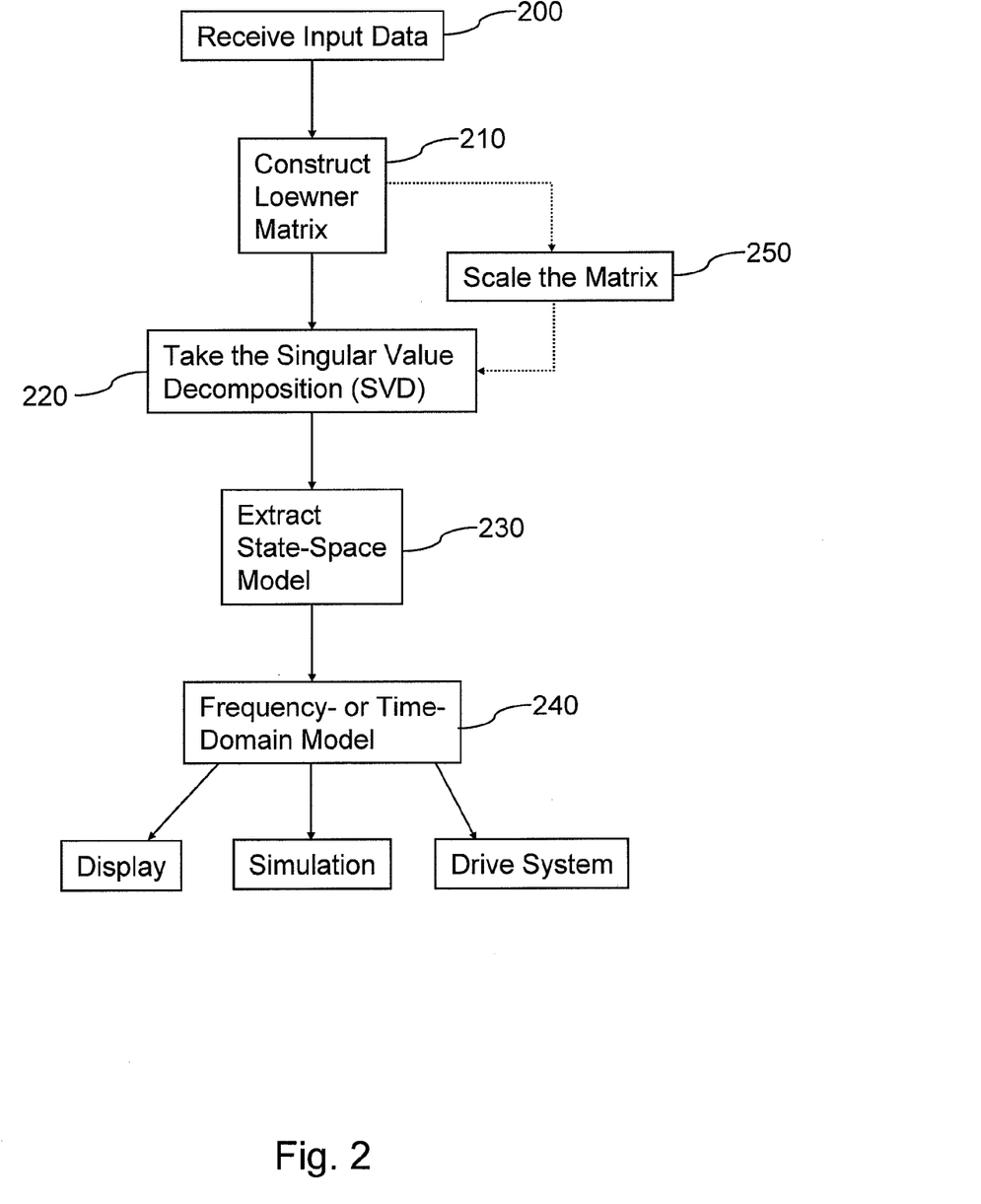
FIG. 2 is a schematic flowchart of an exemplary simulation method in accordance with various embodiments of the invention.

In various embodiments of the invention, simulator 100 analyzes input data and produces simulations as illustrated in FIG. 2. In step 200, simulator 100 receives input data, e.g., the frequency-domain representation of a system or network, as described above. For example, the input data may be received from input module 160 or decomposition module 165, or may be received directly from the second simulator 175 or from a mass storage device 115. The input data will generally include or consist essentially of a set of S-parameters; if the input data is in a raw, undecomposed form, it may first be processed in decomposition module 165 into a set of S-parameters.

In step 210, a Loewner matrix is constructed from the input data by analysis module 145. First, the input data (also herein referred to as "frequencies," as the input data is generally a frequency-domain representation of a system or network) is separated into two groups, one denoted as "top frequencies" ($\bar{s}_i$) and the other as "side frequencies" ($\hat{s}_j$). The number of top frequencies is denoted as $\bar{q}$, and the number of side frequencies is denoted as $\hat{q}$. In an embodiment, every other frequency in the input data is assigned to the set of top frequencies while the other, "interleaved" frequencies are assigned to the set of side frequencies. In a preferred embodiment, a plurality of frequencies at the beginning and a plurality of frequencies at the end of the input dataset are assigned to the set of top frequencies in order to better match those frequencies when simulating utilizing various embodiments of the invention described below. For example, the first three and last three frequencies of the input data may be assigned to the set of top frequencies (as well as every other frequency in between, as described above). As described below, in various embodiments, once the SVD of the Loewner matrix has been computed, the state-space model A matrix is derived utilizing only the top frequencies (with the SVD) for improved computational efficiency. In other embodiments, both the top and side frequencies are utilized (with the SVD) in order to generate a more accurate A matrix.

Next, a Loewner matrix is formed from the input data by analysis module 145. The entries $L_{ij}$ of the Loewner matrix are divided differences of the input data, as reflected in Equation 4.

$$L_{ij} = \frac{H(\bar{s}_i) - H(\hat{s}_j)}{\bar{s}_i - \hat{s}_j} \tag{4}$$

This representation is equal to $$L_{ij} = \frac{C(\bar{s}_i I - A)^{-1} B - C(\hat{s}_j I - A)^{-1} B}{\bar{s}_i - \hat{s}_j} \tag{5}$$

or $$L_{ij} = \frac{C[(\bar{s}_i I - A)^{-1} - (\hat{s}_j I - A)^{-1}]B}{\bar{s}_i - \hat{s}_j} \tag{6}$$

Thus, in this exemplary embodiment, each $L_{ij}$ term is a block matrix, of size p-by-p. Therefore, the entire Loewner matrix L has $p\hat{q}$ rows, and $p\bar{q}$ columns.

In Equation 6, the term $$(\bar{s}_i I - A)^{-1} - (\hat{s}_j I - A)^{-1} \tag{7}$$

is premultiplied by the identity matrix, written as $(\hat{s}_j I - A)^{-1} (\hat{s}_j I - A)$, and postmultiplied by the identity matrix, written as $(\bar{s}_i I - A)(\bar{s}_i I - A)^{-1}$, resulting in:

$$(\hat{s}_j I - A)^{-1} X (\hat{s}_j I - A)(\bar{s}_i I - A)^{-1} \tag{8}$$

where X is defined in Equation 9:

$$X \equiv (\hat{s}_j I - A)((\bar{s}_i I - A)^{-1} - (\hat{s}_j I - A)^{-1})(\bar{s}_i I - A) \tag{9}$$

X is then rewritten as $$X = (\hat{s}_j I - A) - (\bar{s}_i I - A) \tag{10}$$

which gives $$X = (\hat{s}_j - \bar{s}_i) I \tag{11}$$

This value of X is substituted into Equation 6, resulting in $$L_{ij} = -C(\hat{s}_j I - A)^{-1} (\bar{s}_i I - A)^{-1} B \tag{12}$$

In an embodiment, the number of frequencies is greater than the number of states (i.e., the number of frequencies within the input data exceeds the number of possible system states), implying that the Loewner matrix has low rank and is the product of two matrices with rank equal to the number of states, as in Equation 13:

$$L_{ij} = -[C(\hat{s}_j I - A)^{-1}] [(\bar{s}_i I - A)^{-1} B] \tag{13}$$

In step 220, analysis module 145 generates a low-rank approximation of the Loewner matrix (from which the state-space model will be generated, as further described below). In an embodiment, the low-rank approximation is generated via the SVD of the Loewner matrix, as depicted in Equation 14:

$$L = USV^H \quad (14)$$

where U represents the left singular vectors, S represents a diagonal matrix of the singular values, and V represents the right singular vectors.

Since the singular values are all positive, and given the definition of the SVD, in decreasing order, the low-rank approximation to the Loewner matrix L may be generated as follows. The rank is assumed to be n, and thus:

$$L \approx [U(:,1:n)S(1:n,1:n)][V(:,1:n)^H] \quad (15)$$

This low-rank approximation to L implies a state-space approximation to L, of order n. In particular, for all $\bar{s}_i$, $$V(r_i,1:n)^H = (\bar{s}_i I - A)^{-1} B \quad (16)$$

where $r_j$ is the range of indices for the rows of V that correspond to the block of input side frequencies $\hat{s}_j$. Typically, this range has p entries. The largest rejected singular value indicates the fidelity of the approximation to the Loewner matrix L, and therefore indicates the goodness of fit for the derived state-space system. The input data frequencies may be distributed in a non-uniform fashion; in such cases, frequency scaling may be utilized to obtain a better fit (as described further below).

In step 230, analysis module 145 extracts the state-space model from the low-rank approximation of the Loewner matrix. First, Equation 16 may be rewritten as follows:

$$\forall \bar{s}_i, (\bar{s}_i I - A) V(r_i, 1:n)^H = B \quad (17)$$

and the following matrix equation is written with A and B as unknowns:

$$\begin{bmatrix} V(r_1, 1:n)^* & W \\ V(r_2, 1:n)^* & W \\ V(r_3, 1:n)^* & W \\ \vdots & \vdots \\ V(r_m, 1:n)^* & W \end{bmatrix} \begin{bmatrix} A^T \\ B^T \end{bmatrix} = \begin{bmatrix} \bar{s}_1 V(r_1, 1:n)^* \\ \bar{s}_2 V(r_2, 1:n)^* \\ \bar{s}_3 V(r_3, 1:n)^* \\ \vdots \\ \bar{s}_m V(r_m, 1:n)^* \end{bmatrix} \quad (18)$$

where the * notation indicates the complex conjugate (i.e., the transpose of the Hermitian) and W is a row-vector of ones of width equal to the number of ports (i.e., the width of B). The matrix on the left-hand side of Equation 18, denoted here as $\tilde{V}$, may be QR factored once (in order $(n+p)^2 \bar{q} p$ operations) and solved n times (in order $n(n+p)\bar{q}p$ operations). Equation 18 is solved in a least-squares sense, using, e.g., QR decomposition, to yield approximations for A and B. The eigenvalues of A indicate the poles of the approximation. Then, by assuming a canonical form for B, the C and D matrices are calculated using, e.g., a linear least-squares technique to approximate the residues of those poles. Together, the A, B, C, and D matrices provide the state-space model corresponding to the input data provided in step 200.

Generally, the A matrix is complex, and without care being taken to include negative frequencies in the original Loewner matrix, and distributing the frequencies symmetrically between top frequencies and side frequencies, the poles of the A matrix may not be either purely real or arise in complex-conjugate pairs. Thus, in some embodiments, the A matrix derived by this procedure is not similar to a real matrix.

In some instances, the derived A matrix may not be stable (an issue shared with the above-described vector- and rational-fitting methods). The instability is usually due to non-causal data, which tend to generate unstable poles, i.e., eigenvalues of the A matrix with positive real parts. Such poles may be corrected before the state-space model is utilized for transient simulation, e.g., by removal of or by changing the sign of the real part of the unstable poles.

In the embodiment described above, the step 230 extraction of the state-space model utilizes only the right singular vectors V to derive the A matrix. This method is very computationally efficient, as it involves solving for the n columns of the stacked $A^T$ and $B^T$ matrices simultaneously, resulting in an average of $O(n^2 \bar{q})$ computations. However, decreased accuracy may result, depending on the distribution of the input data between the top and side frequencies.

In another embodiment, described below, both the left singular vectors U and the right singular vectors V are utilized in step 230. First, both U and V are scaled by the square roots of the singular values:

$$U_s = U\sqrt{S} \quad (19A)$$

$$V_s = V\sqrt{S} \quad (19B)$$

The embodiment continues with Equation 16 again, rewritten here as Equation 19C:

$$\forall \bar{s}_i, V_S(r_i, 1:n)^H = (\bar{s}_i I - A)^{-1} B \quad (19C)$$

Defining $V_i$ as $V_S(r_i, 1:n)$, Equation 19C is rewritten as:

$$\forall \bar{s}_i, B + A V_i^H = \bar{s}_i V_i^H \quad (20)$$

An equation analogous to Equation 19C is utilized for the side frequencies:

$$\forall \hat{s}_j, C(\hat{s}_j I - A)^{-1} = U_S(r_j, 1:n) \quad (21)$$

which, if $U_j$ is defined as $U_S(r_j, 1:n)$, may be rewritten as:

$$\forall \hat{s}_j, C + U_j A = \hat{s}_j U_j \quad (22)$$

As shown above, A is multiplied on the right side in Equation 20, while A is multiplied on the left side in Equation 22. Thus, in order to combine Equations 20 and 22, Kronecker identities are utilized to extract the unknowns in a consistent manner. First, the vec operator is applied to Equation 20, resulting in:

$$\forall \bar{s}_i, \text{vec}B + \text{vec}AV_i^H = \bar{s}_i \text{vec} V_i^H \quad (23)$$

which, utilizing the Kronecker identity $$\text{vec}AB = (B^T \otimes I)\text{vec}A \quad (24)$$

results in:

$$\forall \bar{s}_i, \text{vec}B + (V_i \otimes I_n)\text{vec}A = \bar{s}_i \text{vec} V_i^H \quad (25)$$

Where $I_n$ is the identity matrix of size n.

Similarly, the vec operator is applied to Equation 22, and the other Kronecker identity $$\text{vec}AB = (I \otimes A)\text{vec}B \quad (26)$$

is utilized, resulting in:

$$\forall \hat{s}_j, \text{vec}C + (I_n \otimes U_j)\text{vec}A = \hat{s}_j \text{vec} U_j \quad (27)$$

As described below, a least-squares approach may be used to solve for the unknowns A, B, and C by first placing the unknowns into a large vector, and then forming a large sparse matrix for the relationships indicated in Equations 25 and 27. First, $1_m$ is defined as a column vector of ones of length m, $\bar{\Omega}$ is defined as a diagonal matrix of the $\bar{s}$ top frequencies, and $\hat{\Omega}$ is defined as a diagonal matrix of the $\hat{s}$ side frequencies. Finally, $U_n$ and $V_n$ are defined as $U_S(:,1:n)$ and $V_S(:,1:n)$, respectively. An unknown vector x is defined as:

$$x = \begin{bmatrix} vecA \\ vecB \\ vecC \end{bmatrix} \quad (28)$$

a matrix M is defined as:

$$M = \begin{bmatrix} V_n^* \otimes I_n & 1_{\bar{q}} \otimes (I_p \otimes I_n) & 0 \\ I_n \otimes U_n & 0 & I_n \otimes (1_{\hat{q}} \otimes I_p) \end{bmatrix} \quad (29)$$

and a vector b is defined as:

$$b = \begin{bmatrix} [\bar{\Omega} \otimes (I_n \otimes I_p)] vec V_n^H \\ [(I_n \otimes \hat{\Omega}) \otimes I_p] vec U_n \end{bmatrix} \quad (30)$$

Then, $$Mx = b \quad (31)$$

is solved using a least-squares technique, e.g., either by doing a QR decomposition of M, or by forming the normal equations $$M^H M x = M^H b \quad (32)$$

The normal equations may be formed with moderate efficiency, at the cost of a deterioration of the conditioning of the system in some embodiments. Once Equation 31 is solved, the A matrix is extracted, and the remainder of the state-space system is derived as discussed above. Advantageously, all frequencies of the input data are considered in this embodiment, at the expense of increased computation time (a worst-case scenario of $O(n^4 p(\bar{q}+\hat{q}))$ computations).

Still referring to FIG. 2, in step 240, the state-space model extracted in step 230 is utilized in a frequency- or time-domain simulation by simulation module 150. For example, in the frequency domain, the state-space model may be utilized to interpolate frequencies not present in the input data. In the time domain, the state-space model may be utilized in a transient simulation of the physical system (e.g., an electronic circuit) being modeled. The state-space model may be straightforwardly embedded within a transient simulator, e.g., NEXXIM, available from Ansoft, LLC of Pittsburgh, Pa.; such simulators are designed to accept and base simulation on a state-space model. As indicated in FIG. 2, the outputs of such simulations may be utilized as inputs for further simulations or may be displayed in text or graphical form, e.g., on display 135. The outputs may also be utilized to drive actual systems, e.g., the output of a transient simulation of an electronic circuit may be utilized to drive an external electronic circuit 180 connected to simulator 100 via, e.g., an analog/digital converter.

Frequency Scaling

While the above-described approaches to forming a low-rank approximation to a Loewner matrix bounds the error of the approximation by the largest neglected singular value, a good approximation to the Loewner matrix does not necessarily indicate a good approximation to the original S-parameter data. Thus, in various embodiments, an optional step 250 is performed between steps 210 and 220, as depicted in FIG. 2. In step 250, the Loewner matrix is scaled to approximately match the distribution of frequencies in the input data as described below. The scaling may be, e.g., approximately linear, approximately logarithmic, or a combination of the two.

If, as described above, the Loewner matrix is formed as $$L_{ij} = \frac{H(\bar{s}_i) - H(\hat{s}_j)}{\bar{s}_i - \hat{s}_j} \quad (33)$$

then the Loewner matrix may tend to be dominated by entries from nearby frequencies. And, if the frequencies are not uniformly distributed, the values at closely spaced frequencies will be emphasized over the others. So, for example, with logarithmic frequency spacing, the state-space fit from the raw Loewner matrix might match well at low frequencies and poorly at high frequencies.

This problem is ameliorated in step 250 by modifying the Loewner matrix with a frequency scaling that compensates for the input data distribution.

First, $\bar{\sigma}_i$ is defined as the absolute value of the minimum difference between a top frequency $\bar{s}_i$ and all of the $\hat{s}_j$ side frequencies. Similarly, $\hat{\sigma}_j$ is defined as the absolute value of the minimum difference between a side frequency $\hat{s}_j$ and all of the $\bar{s}_i$ top frequencies. Then, a modified Loewner matrix is constructed according to:

$$\tilde{L}_{ij} = \sqrt{\bar{\sigma}_i \hat{\sigma}_j} \frac{H(\bar{s}_i) - H(\hat{s}_j)}{\bar{s}_i - \hat{s}_j} \quad (34)$$

For those i-j pairs at the minimum distance between the frequencies, the entries of the modified Loewner matrix will essentially be $H(\bar{s}_i) - H(\hat{s}_j)$, and so a low-rank approximation that works well for the modified Loewner matrix will also work well for fitting the S-parameters directly.

The scaling of step 250 is compensated for in later steps by incorporating a scaling term, e.g., by altering Equation 16 as follows:

$$\forall \bar{s}_i, V(r_i, 1:n)^H = \sqrt{\bar{\sigma}_i} (\bar{s}_i I - A)^{-1} B \quad (35)$$

Examples

The above-described techniques have been utilized to extract state-space models of various sets of frequency-domain input data. First, the two-port S-parameters of a 1 ns section of 75-ohm transmission line were utilized as input data. The transmission line introduces frequency-dependent distortions into a signal traveling through the line, and it is this behavior that is captured by the state-space model—i.e., the model predicts the output of the transmission line for an input signal containing multiple frequency components.

Figure 3:
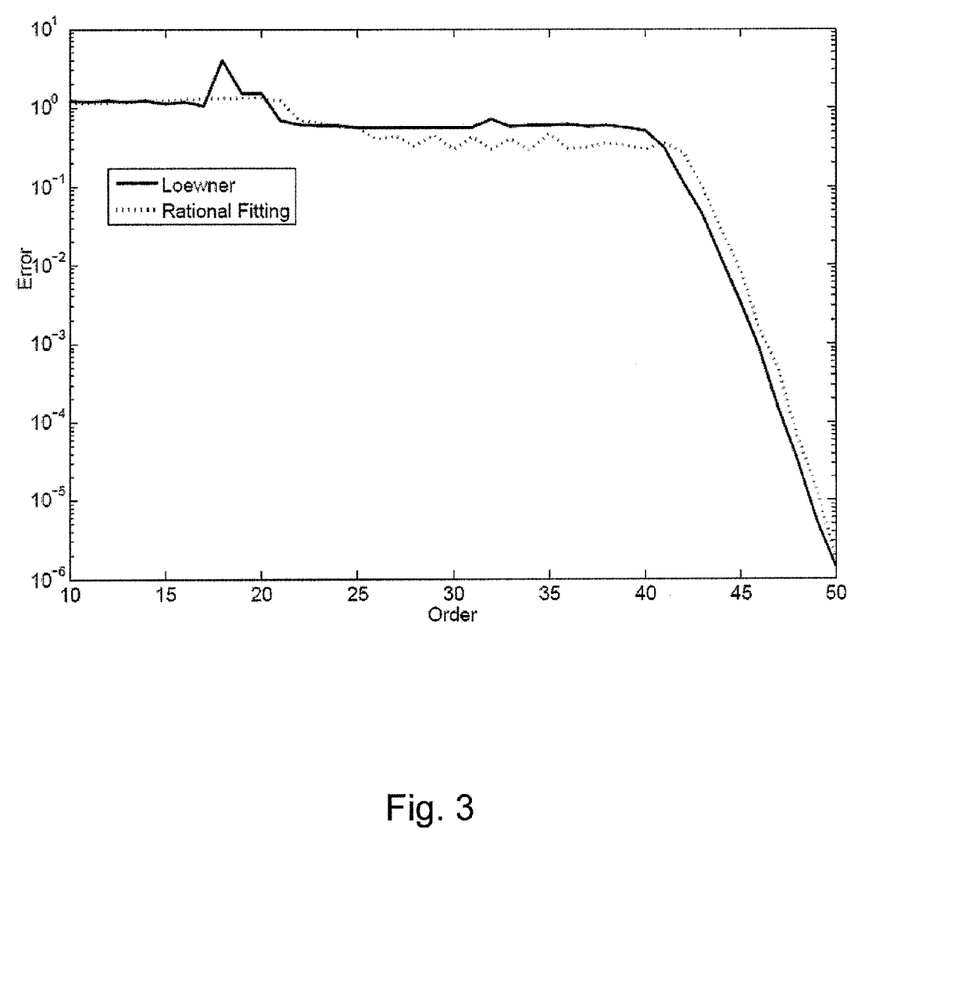
FIGS. 3-5 are exemplary plots of fitting error vs. the order of the state-space model generated in accordance with various embodiments of the invention.

The modeling data were provided on a linear frequency grid, 1001 points from 0 to 10 GHz; that is, each point corresponds to a frequency-specific function which, when applied to an input signal at that frequency, produces the noise-containing output signal from the modeled transmission line. For comparative purposes, the prior-art rational-fitting variation of the vector-fitting method was also utilized to extract a state-space model of the input data. After extraction of the state-space models, the error of the fit as a function of the order of the state-space model was calculated for both the Loewner-matrix approach described herein and for the rational-fitting method. FIG. 3 depicts the results. In this example, the present approach provides consistently lower error as the error drops below approximately 0.1. Further, the Loewner-matrix technique consumed only approximately 20.9 seconds of computation time, while the prior-art method consumed approximately 104 seconds of computation time.

Figure 4:
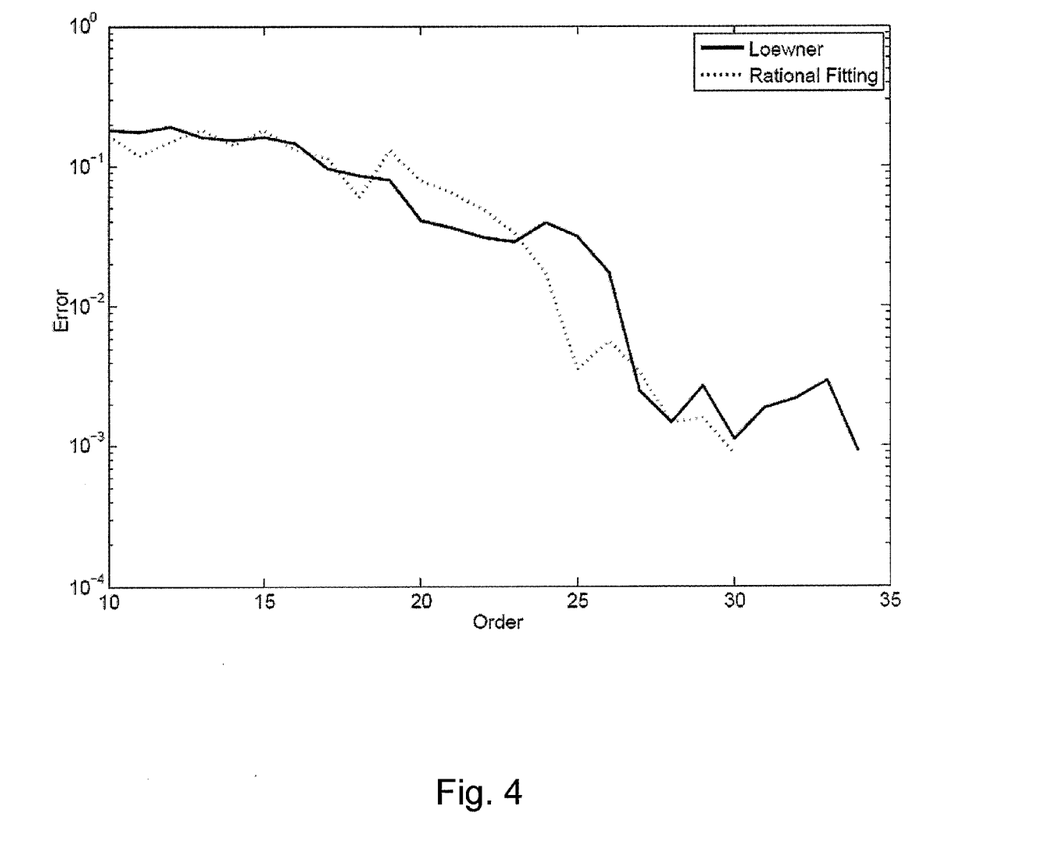

FIG. 4 depicts similar comparative error results for a twelve-port, mixed signal and power integrity model. The modeled device is an integrated circuit that includes five signal leads and one power lead, for a total of twelve ports; input signals can be applied to any of the signal ports, and the model specifies the output signals that would appear on each port as a result. The S-parameter input data was arranged on a mixed logarithmic-linear grid, with a total of 390 data points; each point corresponds to a function relating an input frequency to an output signal. As shown in FIG. 4, the fitting error of the Loewner-matrix method is similar to that of the rational-fitting method. However, the Loewner-matrix method consumed only approximately 36.4 seconds of computation time, while the rational-fitting method consumed approximately 232.4 seconds of computation time.

Figure 5:
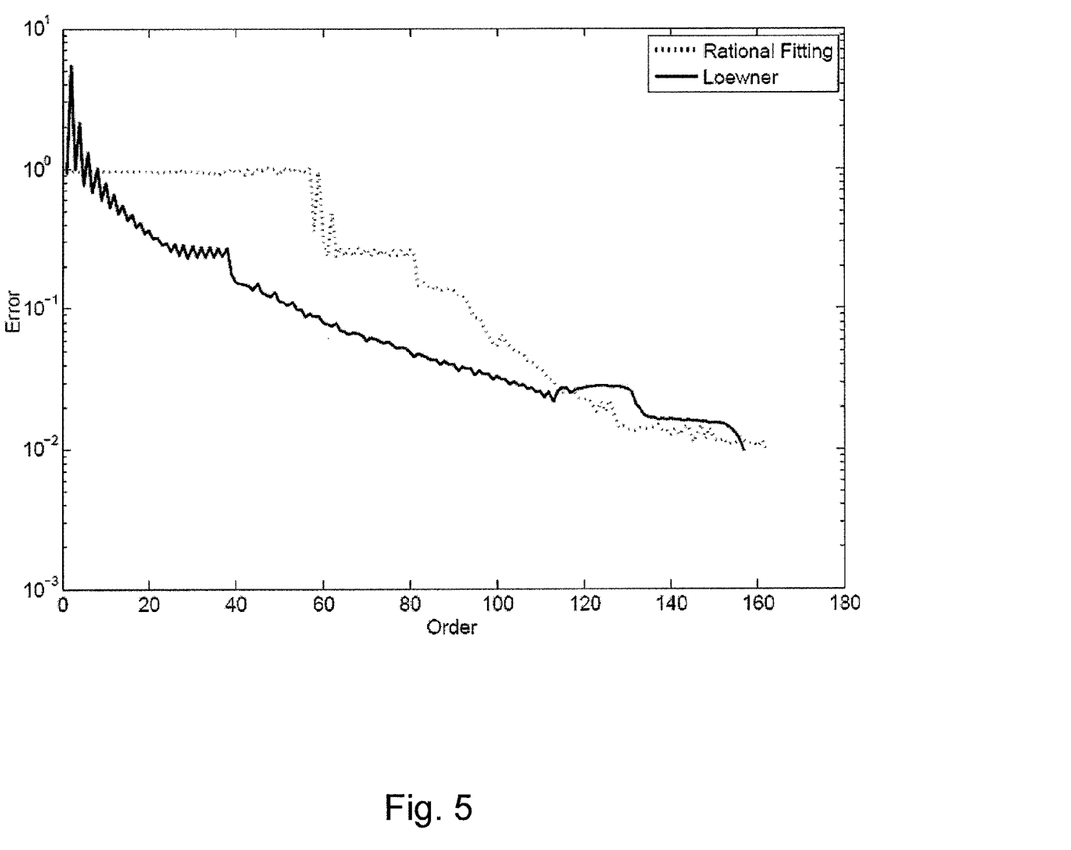

FIG. 5 depicts the comparative fitting error results for a four-port example corresponding to two long, coupled lossy transmission lines. Once again, an input signal is altered or degraded due to the lossy nature of the lines, but also, in this case, due to signal coupling between the two lines. The S-parameter input data was on a mixed logarithmic-linear grid, with a total of 1072 frequency points. As shown in FIG. 5, the Loewner-matrix method exhibits smaller error for much of the order range, and, again, the Loewner-matrix method is significantly more computationally efficient. For this example, the Loewner-matrix method consumed approximately 965.1 seconds of computation time, while the rational-fitting method consumed approximately 8943.7 seconds of computation time.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A simulator comprising:
   a processing module; and
   a memory,
   the processing module being configured as or controlling an analysis module for extracting a state-space model of response of a physical system to an input from a frequency-domain representation of the response, using a singular-value decomposition (SVD) and singular vectors of a Loewner matrix derived by the analysis module from the frequency-domain representation; and
   the processing module being configured as or controlling a simulator module for simulating the response of the physical system in a time domain based on the extracted state-space model.

2. The simulator of claim 1, further comprising an input module for receiving input signals for at least a portion of the modeled physical system.

3. The simulator of claim 2, wherein the modeled physical system comprises an electronic circuit.

4. The simulator of claim 3, wherein the input signals are in the form of digital values representative of signal levels at terminals of the electronic circuit.

5. The simulator of claim 3, wherein the simulator module produces simulated output values from the modeled electronic circuit based on the input signals, and further comprising an output module for supplying the simulated output values to at least one of a display, a device, or another simulator module.

6. The simulator of claim 1, wherein the Loewner matrix is scaled.

7. The simulator of claim 6, wherein the scaled Loewner matrix is frequency-scaled.

8. A method of simulation, the method comprising:
   representing operation of a physical system in frequency domain;
   obtaining a frequency domain representation of a response of the physical system to an input;
   extracting a state-space model of the response using a singular-value decomposition (SVD) and singular vectors of a Loewner matrix derived from the frequency-domain representation; and
   simulating the response of the physical system based on the state-space model.

9. The method of claim 8, wherein the state-space model is a time-domain model.

10. The method of claim 8, wherein the frequency-domain representation comprises a set of scattering parameters.

11. The method of claim 10, wherein extracting the state-space model comprises using the SVD to generate system poles of the state-space model.

12. The method of claim 11, wherein the SVD is used to extract models for a plurality of single input-output relations of the scattering parameters.

13. The method of claim 11, wherein the SVD is used to extract models for each of p single-input p-output columns of relations among the scattering parameters.

14. The method of claim 8, wherein the Loewner matrix is scaled.

15. The method of claim 14, wherein the scaled Loewner matrix is frequency-scaled.

16. The method of claim 8, wherein the SVD indicates an optimal order of the state-space model.

17. The method of claim 8, wherein the physical system comprises an electronic circuit.

18. The method of claim 17, further comprising receiving, from a user, input signals for at least a portion of the electronic circuit.

19. The method of claim 18, wherein the input signals are in the form of digital values representative of signal levels at terminals of the electronic circuit.

20. The method of claim 18, wherein the simulating step produces simulated output values from the modeled electronic circuit.

21. The method of claim 20, further comprising using the output values to drive a device.

22. The method of claim 20, further comprising using the output values to drive a second simulation.

* * * * *